United States Patent
Xu et al.

(10) Patent No.: US 8,530,302 B2
(45) Date of Patent: Sep. 10, 2013

(54) METHOD FOR MANUFACTURING CMOS FET

(75) Inventors: Qiuxia Xu, Beijing (CN); Yongliang Li, Beijing (CN); Gaobo Xu, Beijing (CN)

(73) Assignee: The Institute of Microelectronics, Chinese Academy of Science, Beijing (CN)

( * ) Notice: Subject to any disclaimer, the term of this patent is extended or adjusted under 35 U.S.C. 154(b) by 0 days.

(21) Appl. No.: 13/576,658

(22) PCT Filed: Nov. 22, 2011

(86) PCT No.: PCT/CN2011/082585
§ 371 (c)(1),
(2), (4) Date: Aug. 2, 2012

(87) PCT Pub. No.: WO2013/016917
PCT Pub. Date: Feb. 7, 2013

(65) Prior Publication Data
US 2013/0078773 A1 Mar. 28, 2013

(30) Foreign Application Priority Data
Aug. 3, 2011 (CN) .......................... 2011 1 0221375

(51) Int. Cl.
*H01L 21/8238* (2006.01)
*H01L 21/4763* (2006.01)

(52) U.S. Cl.
USPC ............ 438/216; 438/275; 438/287; 438/591

(58) Field of Classification Search
USPC ................ 438/142, 149, 197, 199, 229, 234, 438/240, 275, 287, 585–595
See application file for complete search history.

(56) References Cited

U.S. PATENT DOCUMENTS

| | | | | |
|---|---|---|---|---|
| 7,952,118 B2 * | 5/2011 | Jung et al. | ...................... | 257/206 |
| 8,163,620 B2 * | 4/2012 | Li et al. | ......................... | 438/287 |
| 8,258,063 B2 * | 9/2012 | Xu et al. | ........................ | 438/720 |

(Continued)

FOREIGN PATENT DOCUMENTS

| CN | 101320734 A | 12/2008 |
|---|---|---|
| CN | 101447420 A | 6/2009 |

(Continued)

*Primary Examiner* — Mary Wilczewski
*Assistant Examiner* — Erik T Peterson

(57) ABSTRACT

A method for manufacturing a CMOS FET comprises forming a first interfacial $SiO_2$ layer on a semiconductor substrate after formation a conventional dielectric isolation; forming a stack a first high-K gate dielectric/a first metal gate; depositing a first hard mask; patterning the first hard mask by lithography and etching; etching the portions of the first metal gate and the first high-K gate dielectric that are not covered by the first hard mask. A second interfacial $SiO_2$ layer and a stack of a second high-K gate dielectric/a second metal gate are then formed; a second hard mask is deposited and patterned by lithograph and etching; the portions of the second metal gate and the second high-K gate dielectric that are not covered by the second hard mask are etched to expose the first hard mask on the first metal gate. The first hard mask and the second hard mask are removed by etching; a polysilicon layer and a third hard mask are deposited and patterned by lithography and etching to form a gate stack; a dielectric layer is deposited and etched to form first spacers. Source/drain regions and their extensions are then formed by a conventional process, and silicides are formed by silicidation to provide contact and metallization.

10 Claims, 2 Drawing Sheets

(56) References Cited

U.S. PATENT DOCUMENTS

| | | | |
|---|---|---|---|
| 8,298,927 B2 * | 10/2012 | Xu et al. | 438/591 |
| 8,334,205 B2 * | 12/2012 | Xu et al. | 438/656 |
| 8,367,558 B2 * | 2/2013 | Xu et al. | 438/778 |
| 2006/0094192 A1 * | 5/2006 | Yang et al. | 438/287 |
| 2007/0178633 A1 * | 8/2007 | Adetutu et al. | 438/199 |
| 2009/0146215 A1 * | 6/2009 | Ogawa | 257/369 |
| 2009/0152650 A1 * | 6/2009 | Chudzik et al. | 257/410 |
| 2009/0212371 A1 * | 8/2009 | Kobayashi | 257/369 |
| 2009/0250760 A1 | 10/2009 | Chudzik et al. | |

FOREIGN PATENT DOCUMENTS

| | | |
|---|---|---|
| CN | 101673710 A | 3/2010 |
| CN | 101847604 A | 9/2010 |
| CN | 102110653 A | 6/2011 |

\* cited by examiner

METHOD FOR MANUFACTURING CMOS FET

CROSS REFERENCE TO RELATED APPLICATION

This application is a National Phase application of, and claims priority to, PCT Application No. PCT/CN2011/082585, filed on Nov. 22, 2011, entitled "METHOD FOR MANUFACTURING CMOS FET", which claims priority to the Chinese Patent Application No. 201110221375.7 filed on Aug. 3, 2011. Both the PCT Application and Chinese Application are incorporated herein by reference in their entireties.

TECHNICAL FIELD

The present disclosure relates to semiconductor technology, and in particular, to an integration implementation of double metal gates/double high-K gate dielectrics in a complementary metal-oxide-semiconductor (CMOS) field effect transistor (FET). The integration implementation of double metal gates/double high-K gate dielectrics is applicable to a high-performance nano-CMOS device under 32/22 nm technical node and beyond.

BACKGROUND

With rapid development of integrated circuit technology, the feature size of a CMOS device is continuously reduced both in a longitudinal direction and in a lateral direction. A gate dielectric needs to have a thickness smaller than 8 angstroms, or even smaller than 6 angstroms, which is equivalent to a thickness of 2-3 atomic layers, so as to suppress short channel effects due to the reduced size. A gate tunneling current increases remarkably in exponential relation to the thickness of the gate dielectric. Consequently, the device does not function properly. A high-K gate dielectric has a larger physical thickness than a conventional gate dielectric such as $SiO_2$ with the same gate capacitance, and may be used for replacing the latter to decrease the gate tunneling leakage current remarkably. However, a conventional polysilicon gate is incompatible with the high-K gate dielectric and causes severe Fermi pinning effect, and needs also to be replaced by a novel metal gate. The metal gate not only eliminates a depletion effect of the polysilicon gate to decrease a gate resistance, but also eliminates boron penetration to improve reliability of the device. A gate dielectric having a high dielectric constant (K) and a metal gate represent a tendency of development in advanced technology of the high-performance nano-integrated circuit. However, there are many challenges in the integrated implementation of the metal gate with the high-K dielectric, such as thermal stability and interfacial state. Particularly, the Fermi pinning effect is big challenge for achieving the desired low threshold voltage of the nano-CMOS device, especially in a gate-first process. To achieve the desired low threshold voltage of the nano-CMOS device, an effective work function of an NMOS device should be near a bottom of a conduction band of Si, i.e. about 4.1 eV, and an effective work function of a PMOS device should be near a top of a valence band of Si, i.e. about 5.2 eV. Thus, the NMOS device and the PMOS device typically require different metal gates and high-K dielectrics suitable for the two types of devices respectively. It would therefore be desirable to provide the integration implementation of double metal gates and double high-K dielectrics to fulfill the requirement of the high-performance CMOS device under 45 nm/32 nm/22 nm technical node and beyond.

SUMMARY OF THE DISCLOSURE

One object of the present disclosure is to provide an integration implementation of double metal gates and double high-K dielectrics in a CMOS device to meet challenges in the conventional CMOS technology.

To achieve the above object, the present disclosure provides a method for integrating double metal gates and double high-K dielectrics in a CMOS device. The method is characterized in that a first interfacial $SiO_2$ layer is first grown on a semiconductor substrate after completing a conventional STI or LOCOS; a stack of first high-K gate dielectric/metal gate is then formed; a first hard mask of amorphous silicon is then grown on the stack; the first hard mask is patterned by lithograph and etching; the portions of the stack of the first metal gate and the first high-K gate dielectric that are not covered by the first hard mask are etched in sequence with high selectivity by wet etching. An interfacial $SiO_2$ layer and a stack of second high-K gate dielectric/second metal gate are then formed. A second hard mask of amorphous silicon is then grown on the stack. The second hard mask is patterned by lithograph and etching; the portions of the stack of the second metal gate and the second high-K gate dielectric that are not covered by the second hard mask are etched in sequence with high selectivity to expose the first hard mask of amorphous silicon on the first metal gate. The first hard mask of amorphous silicon and the second hard mask of amorphous silicon are then removed simultaneously by wet etching using an etchant which has a high etching ratio with respect to the metal gates and the high-K gate dielectrics. A polysilicon layer and a third hard mask are then deposited, and performing lithograph and etching, to form a nano-scale gate stack. After special cleaning, a dielectric layer is deposited and etched to form first spacers. Then, a conventional ion implantation is performed with a large tilt angle and a low energy. A dielectric layer is deposited and etched to form second spacers. An ion implantation for source/drain is performed, and an activation annealing is then performed, to form source/drain regions. Silicides are then formed to provide contact and metallization.

The method comprises:

Step 1) cleaning: after formation of a device isolation and before formation of an interfacial oxide layer, cleaning a semiconductor substrate by first washing it with a conventional process, and then immersing it in a mixed solution (hydrofluoric acid:isopropanol:water 0.2-1.5:0.01-0.10:100 by volume) at room temperature, and then rinsing it with deionized water, and then spin-drying, and finally baking it in an oven;

Step 2) forming a first interfacial SiO2 layer by rapid thermal oxidation at a temperature of about 600-800° C. for about 20-120 s;

Step 3) forming a first Hf-based high-K dielectric;

Step 4) depositing a first high-K dielectric, and performing a rapid thermal annealing at a temperature of about 600-1050° C. for about 4-120 s in $N_2$;

Step 5) depositing a metal gate of TaN on the first Hf-based high-K dielectric by physical vapor deposition;

Step 6) forming a first hard mask of amorphous silicon on the metal gate of TaN;

Step 7) patterning the first hard mask of amorphous silicon by lithography and dry-etching the first hard mask;

Step 8) selectively etching the portion of the metal gate of TaN that is not covered by the first hard mask using a mixed aqueous solution of $NH_4OH$ and $H_2O_2$;

Step 9) selectively etching the first Hf-based high-K dielectric using a mixed solution of HF, an inorganic acid and water, or a mixed solution of HF, an inorganic acid and an organic solvent;

Step 10) forming a second interfacial $SiO_2$ layer by rapid thermal oxidation and forming a second Hf-based high-K dielectric by physical vapor deposition;

Step 11) performing a rapid thermal annealing at a temperature of about 450-600° C. for about 4-120 s in $N_2$;

Step 12) depositing a second metal gate on the second Hf-based high-K dielectric by physical vapor deposition;

Step 13) forming a second hard mask of amorphous silicon on the second metal gate;

Step 14) patterning the second hard mask of amorphous silicon by lithography and dry-etching the second hard mask;

Step 15) etching the portions of a stack of the second metal gate and the second high-K dielectric that are not covered by the second hard mask of amorphous silicon in sequence with high selectivity by dry etching to expose the first hard mask of amorphous silicon on the first metal gate;

Step 16) removing the first hard mask of amorphous silicon and the second hard mask of amorphous silicon simultaneously by wet etching using an aqueous solution of $NH_4OH$ which has a high etching ratio with respect to the metal gates and the high-K gate dielectrics.

Step 17) depositing a polysilicon layer and a second hard mask dielectric;

Step 18) performing lithography and etching to simultaneously form gate stacks of two different nano-scale dimensions;

Step 19) after cleaning, depositing and etching a dielectric layer to form first spacers;

Step 20) performing a conventional ion implantation with a large tilt angle and a low energy, depositing and etching a dielectric layer to form second spacers, performing an ion implantation for source/drain and an activation annealing to form source/drain regions, and providing contact and metallization by silicides.

The present disclosure has the following beneficial effects:

1. The requirements for work functions of an NMOS device and a PMOS device can be fulfilled respectively by using two metals and two high-K dielectrics to provide the desired low threshold voltage as required by a nano-scale high-performance CMOS circuit.

2. In the present disclosure, two stacks of metal gate/high-K dielectric are separated from each other. Variation of work functions and the relevant reliability issues, due to inter-diffusion of ions between the two stacks of metal gate/high-K dielectric, will not occur. Doped polysilicon with metal silicides thereon provides an electrical connection between the two stacks of metal gate/high-K dielectric.

3. The etchants for etching TaN, high-K dielectric and the hard mask of amorphous silicon has a high etching ratio for respective materials, as required by the integration implementation.

DETAILED DESCRIPTION

The idea of the present disclosure will be described in connection with the attached drawings so as to clarify its characteristic features. The embodiments given below are illustrative and are not to be considered as limiting the disclosure. One skilled person will readily recognize that various modifications and changes may be made to the present disclosure, without departing from the true scope of the present disclosure.

It should be noted that the attached drawings of the present invention are only for illustrative purpose, but not drawn to scale. Thus, the attached drawings should not be construed as limiting or constraining the protection scope of the present disclosure.

Figure 1:
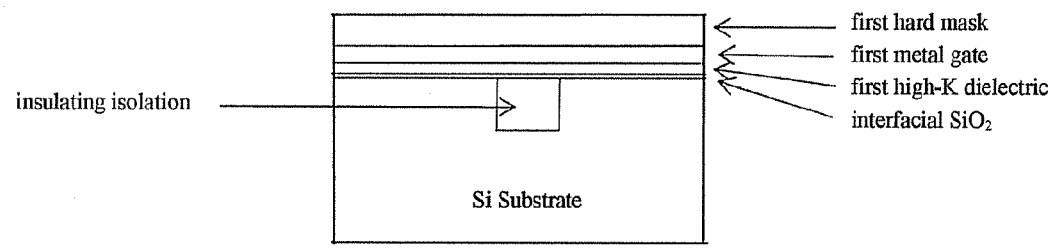
FIG. 1 illustrates a semiconductor structure after a field isolation is formed and a stack of a first high-K dielectric/a first metal gate/a first hard mask is formed on a first interfacial $SiO_2$ layer.
Figure 2:
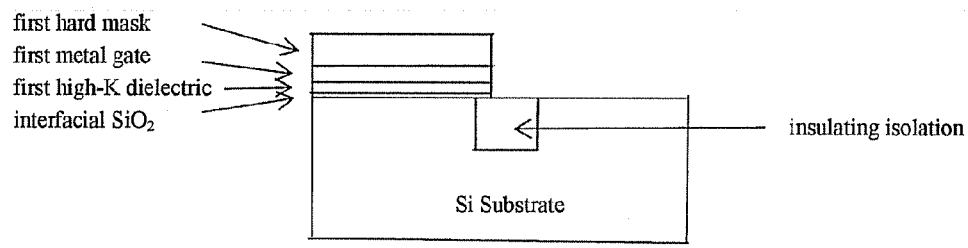
FIG. 2 illustrates a semiconductor structure after the first metal gate, the first high-K dielectric and the first interfacial $SiO_2$ layer are selectively removed for a PMOS device (or an NMOS device)
Figure 3:
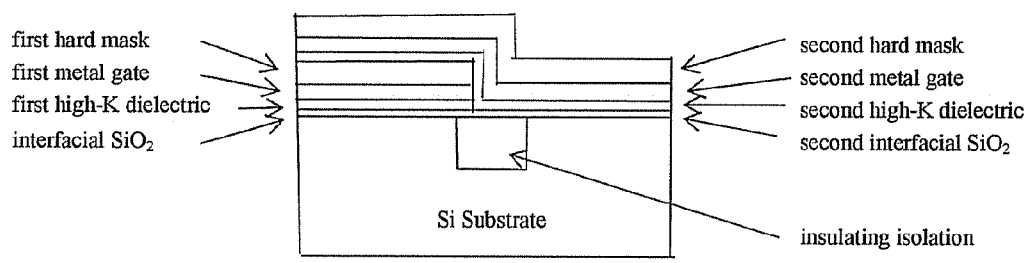
FIG. 3 illustrates a semiconductor structure after a second high-K dielectric, a second metal gate and a second hard mask are deposited on a second interfacial $SiO_2$ layer for a PMOS device (or an NMOS device)
Figure 4:
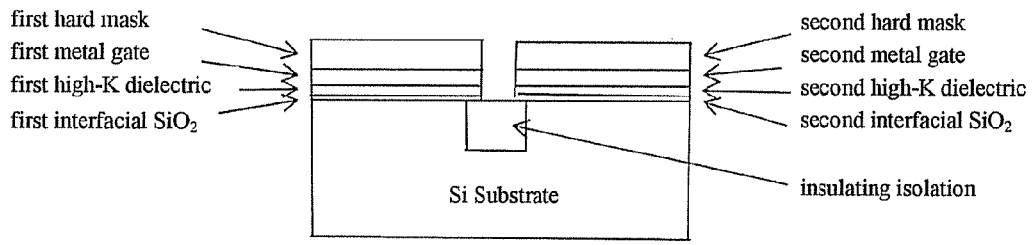
FIG. 4 illustrates a semiconductor structure after the second hard mask/the second metal gate/the second high-K dielectric are selectively removed for an NMOS device (or a PMOS device), where the stack of the second hard mask/the second metal gate/the second high-K dielectric has been separated from the stack of the first hard mask/the first high-K dielectric/the first metal gate.
Figure 5:
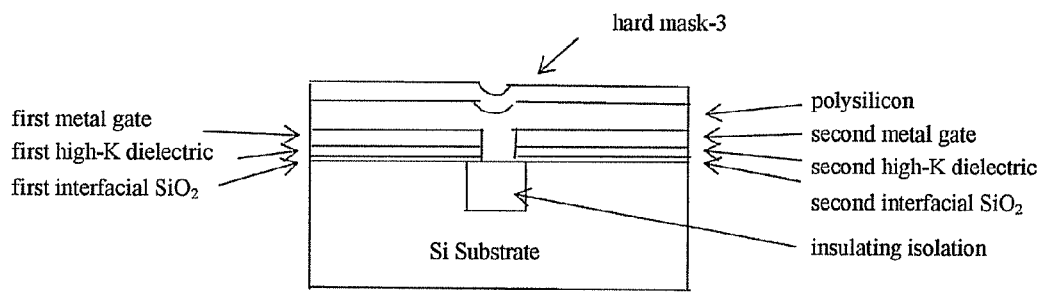
FIG. 5 illustrates as a semiconductor structure after the remaining portions of the first hard mask and the second hard mask are removed and a polysilicon layer and a third hard mask of dielectric are deposited.
Figure 6:
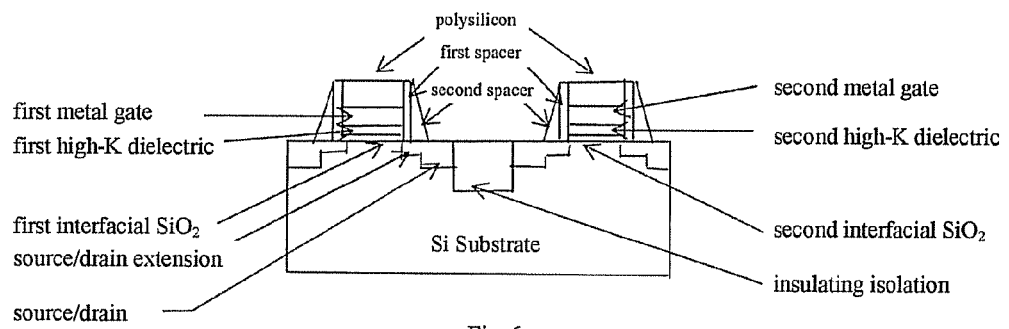
FIG. 6 illustrates a semiconductor structure after gate stacks are formed for an NMOS device and a PMOS device by dry etching, and first spacers, and second spacers and source/drain regions are then formed.

Step 1) cleaning: after formation of a device isolation and before formation of an interfacial oxide layer, cleaning a semiconductor substrate by first washing it with a conventional process, and then immersing it into a mixed solution (hydrofluoric acid:isopropanol:water 0.2-1.5:0.01-0.10:100 by volume) at room temperature, and then rinsing it with deionized water, and then spin-drying, and finally baking it in an oven;

Step 2) forming a first interfacial $SiO_2$ layer by rapid thermal oxidation at a temperature of about 600-800° C. for about 20-120 s, wherein the first interfacial $SiO_2$ layer has a thickness of about 6-8 angstroms;

Step 3) forming a first Hf-based high-K dielectric, such as $La_2O_3/HfO_2$, HfSiO, HfSiON, HfLaO, HfLaON, and the like;

Step 4) after depositing the first Hf-based high-K dielectric, performing a rapid thermal annealing at a temperature of about 600-1050° C. for about 4-120 s in $N_2$;

Step 5) depositing a first metal gate, such as TaN, TiN, and the like, on the first Hf-based high-K dielectric by physical vapor deposition;

Step 6) forming a first hard mask of amorphous silicon on the metal gate of TaN, as shown in FIG. 1;

Step 7) patterning the first hard mask by lithography and dry-etching the first hard mask;

Step 8) selectively etching the portion of the first metal gate of TaN that is not covered by the first hard mask using a mixed aqueous solution of $NH_4OH$ and $H_2O_2$;

wherein the mixed aqueous solution of $NH_4OH$ and $H_2O_2$ has a composition of $NH_4OH:H_2O_2:H_2O=1$-2:1-2:5-6 by volume;

Step 9) selectively etching the first Hf-based high-K dielectric using a mixed solution of HF, HCl and water, or a mixed solution of HF, HCl and an organic solvent, as shown in FIG. 2;

wherein mixed solution of HF, HCl and water (or ethanol, or isopropanol) has a composition of $HF:HCl:H_2O=0.1-1:8-12:100$ by volume;

Step 10) forming a second interfacial $SiO_2$ layer by rapid thermal oxidation at a temperature of about 500-550 °C. for about 40-120 s, and forming a second Hf-based high-K dielectric, such as $Al_2O_3/HfO_2$, HfSiAlON, HfAlO, HfAlON, HfLaON, and the like, by physical vapor deposition;

Step 11) performing a rapid thermal annealing at a temperature of about 400-600° C. for about 4-120 s in $N_2$;

Step 12) depositing a second metal gate, such as MoAlN, MoAl, TiAlN, TiGaN, TaAlN, and the like, on the second Hf-based high-K dielectric by physical vapor deposition;

Step 13) forming a second hard mask of amorphous silicon on the second metal gate, as shown in FIG. 3;

Step 14) patterning the second hard mask of amorphous silicon by lithography and dry-etching the second hard mask;

Step 15) etching the portions of a stack of the second metal gate and the second high-K dielectric that are not covered by the second hard mask of amorphous silicon in sequence with high selectivity by dry etching to expose the first hard mask of amorphous silicon on the first metal gate, wherein the stack of the second hard mask/the second metal gate/the second high-K dielectric is separated from the stack of the first hard mask/the first metal gate/the first high-K dielectric, as shown in FIG. 4;

Step 16) completely removing the first hard mask of amorphous silicon and the second hard mask of amorphous silicon simultaneously by wet etching using an aqueous solution of $NH_4OH$ which has a high etching ratio with respect to the metal gates and the high-K gate dielectrics, wherein the aqueous solution of $NH_4OH$ has a composition of $NH_4OH:H_2O=1-5:10-60$ by volume;

Step 17) depositing a polysilicon layer and a third hard mask of dielectric, wherein the third mask may be one selected from a group consisting of $SiO_2$, PE $Si_3N_4$, and their combinations, as shown in FIG. 5;

Step 18) performing lithography and etching, wherein the third hard mask is etched using a fluorine-based etchant, the polysilicon layer is etched using (Cl+Br)-based etchant, the first metal gate and the second metal gate are etched by high-density plasma etching using a $BCl_3/Cl_2$-based etchant to simultaneously form gate stacks of two different nanoscale dimensions, and finally the Hf-based high-K dielectrics are etched by high-density plasma etching using a $BCl_3$-based etchant;

Step 19) after cleaning, depositing a dielectric layer of $Si_3N_4$ to form first spacers, as shown in FIG. 6, wherein the cleaning is performed for about 10-120 s using a mixed solution of $HF/HCl/H_2O=0.1-0.5:10:100$ by volume to remove the remaining portion of the Hf-based high-K dielectrics and polymers;

Step 20) performing a conventional ion implantation with a large tilt angle and a low energy, depositing a dielectric layer of $SiO_2$ or $SiO_2/Si_3N_4$ and then etching it to form second spacers, performing a conventional ion implantation for source/drain and an activation annealing to form source/drain regions, as shown in FIG. 6, and finally providing contact and metallization by NiSi.

We claim:

1. A method for manufacturing a CMOS FET, comprising:
   1) forming a first interfacial $SiO_2$ layer having a thickness of about 4-12 angstroms on a semiconductor substrate;
   2) forming a first Hf-based high-K gate dielectric, and performing a thermal annealing at a temperature of about 400-1050° C. for about 4-120s in $N_2$;
   3) depositing a first metal gate on the first Hf-based high-K gate dielectric, forming a first hard mask of amorphous silicon on the first metal gate, patterning the first hard mask of amorphous silicon by lithography and etching the first hard mask, and selectively etching off the portions of the first metal gate and the first Hf-based high-K gate dielectric that are not covered by the first hard mask in sequence;
   4) forming a second interfacial $SiO_2$ layer having a thickness of about 4-12 angstroms on the semiconductor substrate, forming a second Hf-based high-K gate dielectric, and performing a thermal annealing at a temperature of about 400-600° C. for about 4-120s in $N_2$;
   5) depositing a second metal gate on the second Hf-based high-K gate dielectric, forming a second hard mask of amorphous silicon on the second metal gate, patterning the second hard mask of amorphous silicon by lithography and etching, etching the portions of the stack of the second metal gate and the second Hf-based high-K gate dielectric that are not covered by the second hard mask of amorphous silicon in sequence to expose the first hard mask of amorphous silicon on the first metal gate, and removing the first hard mask of amorphous silicon and the second hard mask of amorphous silicon simultaneously by wet etching using an aqueous solution of $NH_4OH$;
   6) forming a polysilicon layer and a third hard mask, and performing lithography and etching to form a gate stack; and
   7) after cleaning, depositing and etching a dielectric layer to form first spacers, performing a conventional ion implantation with a large tilt angle and a low energy, depositing and etching a dielectric layer to form second spacers, performing an ion implantation for source/drain and an activation annealing to form source/drain regions, and providing contact and metallization by silicides.

2. The method according to claim 1, wherein the semiconductor substrate in step 1) is first washed with a conventional process, and then immersed in a mixed solution of hydrofluoric acid, isopropanol and water at room temperature, and then rinsed with deionized water, and then spin-dried, and finally baked in an oven, and wherein the mixed solution of hydrofluoric acid, isopropanol and water has a composition of hydrofluoric acid:isopropanol:water 0.2-1.5:0.01-0.10:100 by volume.

3. The method according to claim 1, wherein the first interfacial $SiO_2$ layer in step 1) is formed by rapid thermal oxidation at a temperature of about 600-800° C. for about 20-120s, or by chemical oxidation using $O_3$.

4. The method according to claim 1, wherein the first high-K gate dielectric in step 2) is made of one selected from a group consisting of $La_2O_3/HfO_2$, HfSiO, HfSiON, HfLaO and HfLaON, and formed by one selected from a group consisting of physical vapor deposition, metal-organic chemical vapor deposition and atomic layer deposition.

5. The method according to claim 1, wherein the first metal gate in step 3) is made of TaN or TiN and has a thickness of about 2-50 nm;

the first hard mask of amorphous silicon has a thickness of about 50-100 nm;

an etchant for selectively etching the first metal gate has a composition of $NH_4OH:H_2O_2:H_2O=1\text{-}2:1\text{-}2:5\text{-}6$ by volume; and an etchant for selectively etching the first Hf-based high-K gate dielectric is a mixed solution of HF, HCl and water, or a mixed solution of HF, HCl and an organic solvent, with a composition of $HF:HCl:H_2O$ (or the organic solvent)$=0.1\text{-}1:8\text{-}12:100$ by volume.

6. The method according to claim 1, wherein the second interfacial $SiO_2$ layer in step 4) is formed by rapid thermal oxidation at a temperature of about 480-580° C. for about 40-120 s, or by chemical oxidation using $O_3$;

the second Hf-based high-K gate dielectric is made of one selected from a group consisting of $Al_2O_3/HfO_2$, HfSiAlON, HfAlO, HfAlON and HfLaON.

7. The method according to claim 1, wherein the second metal gate in step 5) is made of one selected from a group consisting of MoAlN, MoAl, TiAlN, TiGaN and TaAlN;

the second metal gate has a thickness of about 2-50 nm;

the second hard mask of amorphous silicon has a thickness of about 50-100 nm;

the second meta gate is etched by plasma etching using a $BCl_3/Cl_2$-based etchant, and the second Hf-based high-K gate dielectric is etched by plasma etching using a $BCl_3$-based etchant; and wherein the aqueous solution of $NH_4OH$ for removing the first hard mask of amorphous silicon and the second hard mask of amorphous silicon by wet etching has a composition of $NH_4OH:H_2O=1\text{-}5:10\text{-}60$ by volume.

8. The method according to claim 1, wherein the third hard mask in step 6) is made of one selected from a group consisting of $SiO_2$, $Si_3N_4$, a stack of $SiO_2/Si_3N_4$ and a stack of $SiO_2/Si_3N_4/SiO_2$; and wherein the third hard mask is made of silicon and etched using a fluorine-based etchant, the polysilicon layer is etched using a Cl-based, F-based, Br-based, (Cl+F)-based or (Cl+Br)-based etchant, the first metal gate and the second metal gate are etched by high-density plasma etching using a $BCl_3/Cl_2$-based etchant to simultaneously form gate stacks of two different nano-scale dimensions, and the Hf-based high-K dielectrics are etched by high-density plasma etching using a $BCl_3$-based etchant.

9. The method according to claim 1, wherein the cleaning in step 7) is performed for about 10-120 s using a mixed solution of $HF:HCl:H_2O=0.1\text{-}0.5:10:100$ by volume, to remove the remaining portions of the Hf-based high-K dielectrics and polymers.

10. The method according to claim 1, wherein in step 7), the dielectric layer for forming the first spacers is made of CVD $Si_3N_4$ or PE $Si_3N_4$; the dielectric layer for forming the second spacers is made of $SiO_2$ or a stack of $SiO_2/Si_3N_4$; and the silicides are NiSi or NiPtSi.

* * * * *